(12) United States Patent
Neukam

(10) Patent No.: US 6,965,073 B2
(45) Date of Patent: Nov. 15, 2005

(54) CONFIGURATION FOR MAKING CONTACT WITH A SLOT ANGLE PIECE

(75) Inventor: Wilhelm Neukam, Bobingen (DE)

(73) Assignee: Fujitsu Siemens Computers GmbH, Munich (DE)

( * ) Notice: Subject to any disclaimer, the term of this patent is extended or adjusted under 35 U.S.C. 154(b) by 189 days.

(21) Appl. No.: 10/386,963

(22) Filed: Mar. 12, 2003

(65) Prior Publication Data
US 2003/0174485 A1 Sep. 18, 2003

(30) Foreign Application Priority Data
Mar. 12, 2002 (DE) .......................... 102 10 710

(51) Int. Cl.⁷ .............................................. H05K 7/14
(52) U.S. Cl. .............................. 174/35 GC; 174/35 R; 361/686; 361/818; 361/816
(58) Field of Search .................... 174/35 GC, 35 R; 361/686, 818, 816

(56) References Cited

U.S. PATENT DOCUMENTS

| 4,873,395 | A | * | 10/1989 | Mast ....................... 174/35 GC |
| 4,924,355 | A | * | 5/1990 | Mitchell et al. ............. 361/686 |
| 5,929,376 | A | * | 7/1999 | Doun et al. ................ 174/35 R |
| 5,975,953 | A | * | 11/1999 | Peterson ....................... 439/607 |
| 6,058,025 | A | * | 5/2000 | Ecker et al. ................. 361/816 |

FOREIGN PATENT DOCUMENTS

DE 100 08 282 A1 9/2001
DE 100 48 101 A1 4/2002

* cited by examiner

Primary Examiner—Dean A. Reichard
Assistant Examiner—Jinhee Lee
(74) Attorney, Agent, or Firm—Laurence A. Greenberg; Werner H. Stemer; Gregory L. Mayback

(57) ABSTRACT

The invention relates to a configuration for making EMC contact between a slot panel in a computer housing and a slot angle piece. The guide rails, into which the slot angle piece is inserted, are provided on perpendicular sections of the slot panel. EMC seals are additionally provided between the slot angle piece and slot panel.

7 Claims, 2 Drawing Sheets

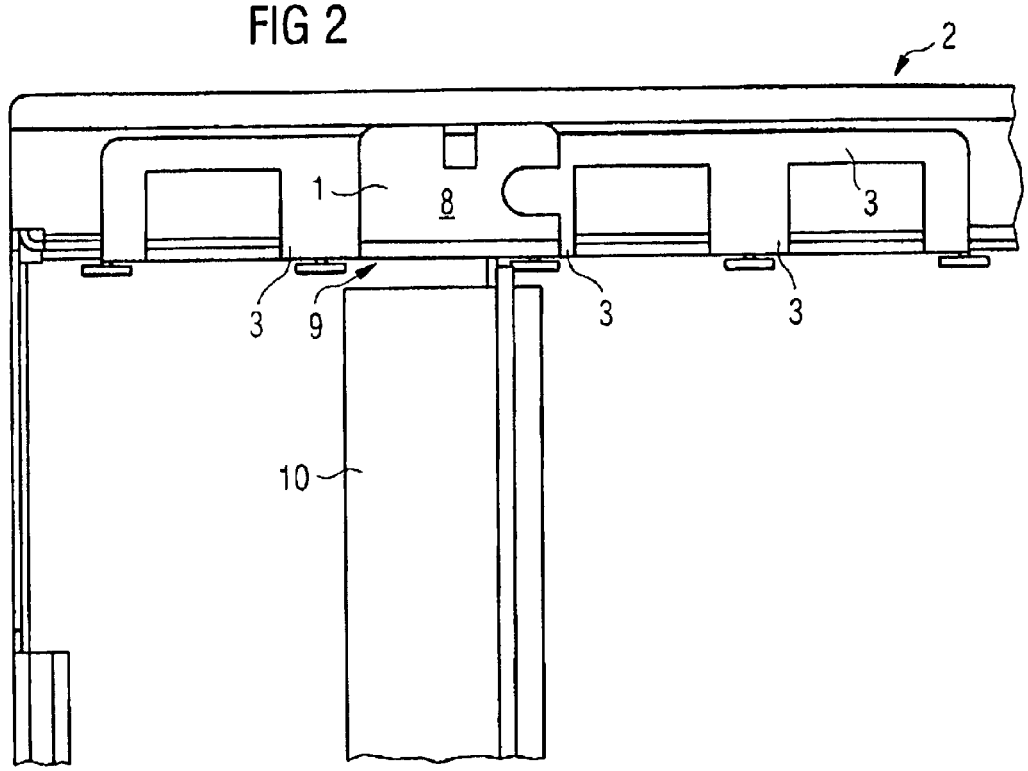
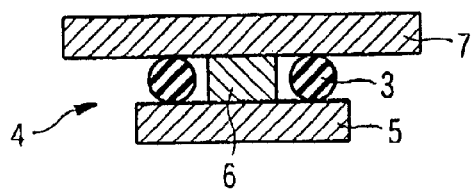
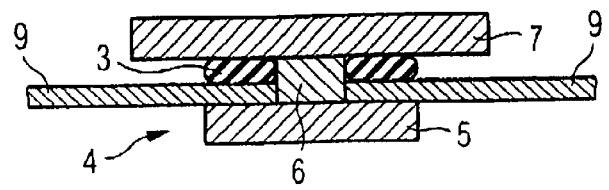

CONFIGURATION FOR MAKING CONTACT WITH A SLOT ANGLE PIECE

BACKGROUND OF THE INVENTION

Field of the Invention

The invention relates to a configuration for making contact between a slot panel in a computer housing and a slot angle piece.

In the prior art, this contact is brought about by using a spring located between the computer housing and the slot angle piece. Such a configuration is known, for example, from Published German Patent Application DE 100 08 282 A1.

New generation processors and memories operate with lower and lower switching voltages as a result of which the components react more and more sensitively to interference voltages. It is no longer sufficient to make EMC (electromagnetic compatibility) contact as is common in the prior art. It is expected that future generations of computer components will be operated with even lower switching voltages, as a result of which the susceptibility to interference voltages will be increased and therefore it will be absolutely necessary to make contact in a better way.

SUMMARY OF THE INVENTION

It is accordingly an object of the invention to provide a configuration for making contact between a slot angle piece and a slot panel in a computer housing, which overcomes the above-mentioned disadvantages of the prior art apparatus of this general type.

With the foregoing and other objects in view there is provided, in accordance with the invention, a configuration, including a computer housing including a slot panel having a guide rail for inserting a slot angle piece.

In accordance with an added feature of the invention, a further guide rail is configured for inserting the slot angle piece between the further guide rail and the guide rail.

In accordance with an additional feature of the invention, the further guide rail includes a carrier perpendicular to the slot panel and a panel parallel to the slot panel; and the guide rail includes a carrier perpendicular to the slot panel and a panel parallel to the slot panel.

In accordance with a further feature of the invention, an EMC seal is configured between the slot angle piece and the slot panel.

In accordance with another feature of the invention, a further guide rail is configured for inserting the slot angle piece between the further guide rail and the guide rail; and an EMC seal configured in the guide rail and in the further guide rail.

In accordance with a further added feature of the invention, the EMC seal is made of a compressible material.

In accordance with a further additional feature of the invention, an EMC seal is configured in the guide rail.

In accordance with yet an added feature of the invention, the EMC seal is made of a compressible material.

In accordance with yet an additional feature of the invention, the slot angle piece includes a perpendicular section that has a thickness; the guide rail defines a clearance width; in a noncompressed state, the EMC seal has a thickness; and the thickness of the EMC seal in the noncompressed state together with the thickness of the perpendicular section of the slot angle piece is greater than the clearance width defined by the guide rail.

In accordance with yet another feature of the invention, when the slot angle piece is inserted, the EMC seal is pressed together and is secured by an opposing force resulting from the slot angle piece.

In accordance with yet a further feature of the invention, an EMC seal is configured between the slot angle piece and the slot panel; the slot angle piece includes a perpendicular section having a thickness; the guide rail defines a clearance width; in a noncompressed state, the EMC seal has a thickness; and the thickness of the EMC seal in the noncompressed state together with the thickness of the perpendicular section of the slot angle piece is greater than the clearance width defined by the guide rail.

In accordance with yet a further an added feature of the invention, an EMC seal is configured between the slot angle piece and the slot panel; and when the slot angle piece is inserted, the EMC seal is pressed together and secured by an opposing force resulting from the slot angle piece.

In particular, it is an object of the invention to ensure optimum contact between the slot angle piece and the computer housing.

The object of the invention is achieved by forming the guide rail, into which the slot angle piece is inserted, on the slot panel.

Such a configuration ensures uniform contact with the entire slot angle piece on the computer housing.

In one preferred embodiment, the guide rail is composed of a carrier that is provided perpendicularly on the slot panel, and a panel that is fitted onto the carrier parallel to the slot panel.

In one advantageous development, an EMC seal is located on the slot panel over the entire bearing face of the slot angle piece.

An increase in the EMC shielding is achieved by arranging the EMC seal in the guide rails.

An advantageous embodiment provides for the seal to be manufactured from a compressible material such as gasket.

In the compressible seal, the thickness of the noncompressed seal together with the thickness of the slot angle piece is advantageously greater than the clear width of the guide rail.

If the slot angle piece is inserted, the seal is pressed together and the shielding is thus reinforced. At the same time, a force acts on the slot angle piece and secures it.

Other features which are considered as characteristic for the invention are set forth in the appended claims.

Although the invention is illustrated and described herein as embodied in a configuration for making contact with a slot angle piece on a slot panel in a computer housing, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

BRIEF DESCRIPTION OF THE DRAWINGS

FIG. 2 is a plan view of a slot panel with a plugged-in PCI card and slot angle piece;

FIG. 3 is a cross sectional view of a different embodiment of the seal, through a guide rail on a slot panel with an inserted EMC seal; and FIG. 4 is a cross sectional view of the embodiment shown in FIG. 3, through a guide rail on the slot panel with an inserted EMC seal and an inserted slot angle piece.

DESCRIPTION OF THE PREFERRED EMBODIMENTS

Figure 1:
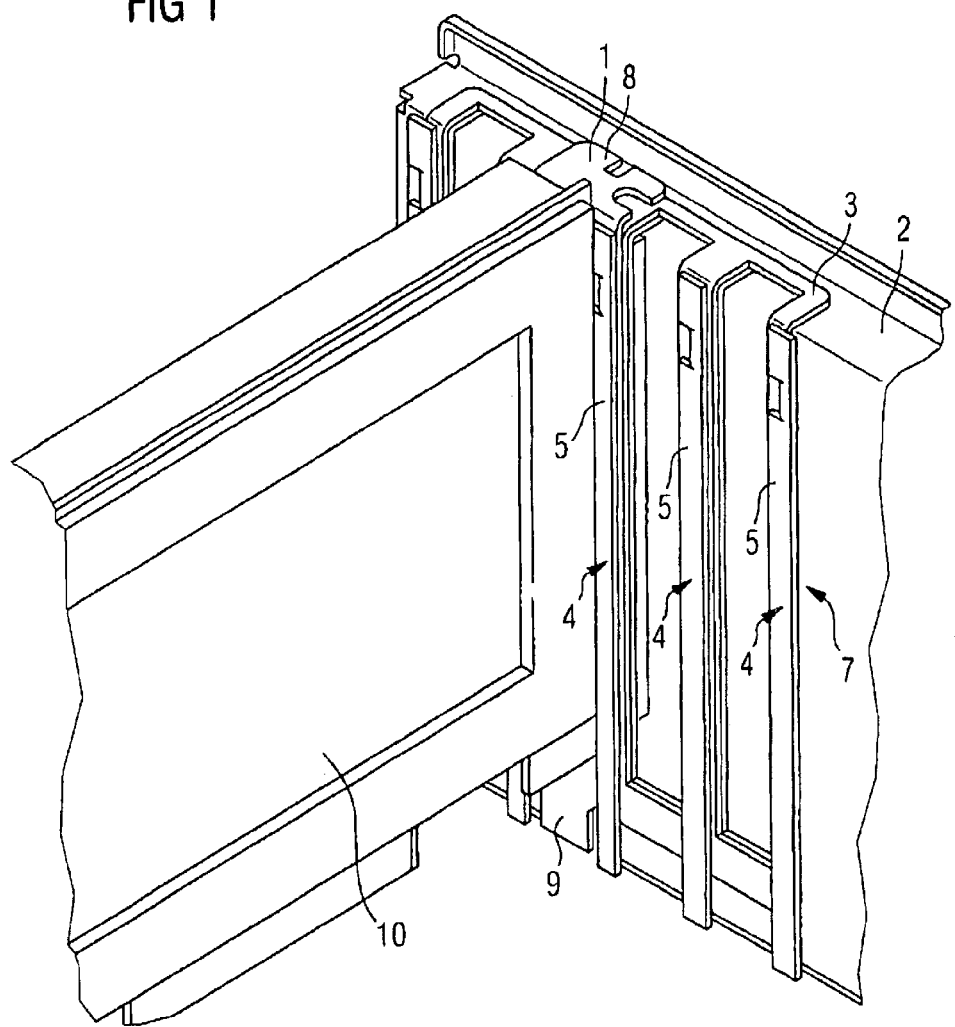
FIG. 1 is an oblique view of a slot panel with a plugged-in PCI plug-in card and slot angle piece.

Referring now to the figures of the drawing in detail and first, particularly, to FIG. 1 thereof, there is shown a slot panel 7 in a computer housing 2 and a PCI (Peripheral Component Interconnect) plug-in card 10 provided on a slot angle piece 1.

The slot angle piece 1 has a perpendicular section 9 as well as a horizontal section 8.

The perpendicular section 9 of the slot angle piece 1 is inserted into two guide rails 4 that are composed of a panel 5 and a carrier 6. The carrier 6 is concealed in FIG. 1. The carrier 6 attaches the panel 5 to the slot panel 7.

An EMC seal 3 is arranged on the supporting face, both for the perpendicular section 9 of the slot angle piece 1 and for the horizontal section 8.

The guide rails 4 are designed only for the perpendicular sections 9 of the slot angle piece 1.

FIG. 2 shows that the EMC seal 3 is also located in the guide rails 4.

FIGS. 3 and 4 show what effect is achieved if the perpendicular section 9 of a slot angle piece 1 is inserted into the guide rail 4.

FIG. 3 is a cross sectional view through the perpendicular section of the slot panel 7, the carrier 6 and the panel 5 which form a guide rail 4. An EMC seal 3 is arranged in the noncompressed state in the guide rail.

FIG. 4 shows the view of FIG. 3, however, in addition, two slot angle pieces 1 have been inserted into the guide rail 4. One slot angle piece 1 is on the right and one slot angle piece 1 is on the left. Only the perpendicular sections 9 of the slot angle pieces 1 are illustrated.

The EMC seals 3 are compressed by the perpendicular sections 9 of the slot angle pieces 1 in such a way that the shielding against interference voltages is at a maximum and also the slot angle piece 1 is pressed against the panel 5.

The invention is not restricted to the exemplary embodiment illustrated. The EMC seal 3 can also be formed at the ends between the slot angle piece and the guide rail, between the slot angle piece and panel 5 or in a U shape in the guide rail.

A woven metal wire (gasket) as well as sheet steel can be used as the EMC seal 3.

I claim:

1. A configuration, comprising a computer housing including a slot panel having a plurality of guide rails for receiving a slot angle piece therebetween, said guide rails each having a T-shaped cross section and including a respective panel parallel to said slot panel and spaced apart from said slot panel for defining a clearance width between said slot panel and said panel and a respective carrier perpendicular to said slot panel for connecting said panel to said slot panel, and said guide rails defining channels for guiding the slot angle piece in a direction parallel to said slot panel, and a compressible EMC seal configured between the slot angle piece and said slot panel in said channels of said guide rails, the slot angle piece compressing said EMC seal in an installed position of the slot angle piece.

2. The configuration according to claim 1, in combination with the slot angle piece, wherein:

the slot angle piece includes a perpendicular section that has a thickness;

in a noncompressed state, said EMC seal has a thickness; and said thickness of said EMC seal in said noncompressed state together with the thickness of the perpendicular section of the slot angle piece is greater than said respective clearance widths defined by said guide rails.

3. The configuration according to claim 2, in combination with the slot angle piece, wherein when the slot angle piece is inserted, said EMC seal is presssd together and is secured by an opposing force resulting from the slot angle piece.

4. The configuration according to claim 1, in combination with the slot angle piece, wherein:

the slot angle piece includes a perpendicular section having a thickness;

in a noncompressed state, said EMC seal has a thickness; and said thickness of said EMC seal in said noncompressed state together with the thickness of the perpendicular section of the slot angle piece is greater than said respective clearance widths defined by said guide rails.

5. The configuration according to claim 4, combination with the slot angle piece, wherein:

when the slot angle piece is inserted, said EMC seal is pressed together and secured by an opposing force resulting from the slot angle piece.

6. The configuration according to claim 1, in combination with the slot angle piece, wherein:

the slot angle piece includes a perpendicular section that has a thickness;

in a noncompressed state, said EMC seal has a thickness; and said thickness of said EMC seal in said noncompressed state together with the thickness of the perpendicular section of the slot angle piece is greater than said respective clearance widths defined by said guide rails.

7. The configuration according to claim 6, in combination with the slot angle piece, wherein when the slot angle piece is inserted, said EMC seal is pressed together and secured by an opposing force resulting from the slot angle piece.

* * * * *